(12) United States Patent
Gietler et al.

(10) Patent No.: US 7,763,955 B2
(45) Date of Patent: Jul. 27, 2010

(54) REDUCING SHUNT CURRENTS IN A SEMICONDUCTOR BODY

(75) Inventors: Herbert Gietler, Villach (AT); Marc Strasser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/241,840

(22) Filed: Sep. 30, 2008

(65) Prior Publication Data

US 2010/0078764 A1 Apr. 1, 2010

(51) Int. Cl.
*H01L 23/62* (2006.01)
(52) U.S. Cl. .......... 257/547; 257/499; 257/544
(58) Field of Classification Search ........ 257/547, 257/536, 552; 438/207, 404; 327/565
See application file for complete search history.

(56) References Cited

U.S. PATENT DOCUMENTS

| 4,027,325 A * | 5/1977 | Genesi ............ 257/547 |
| 5,514,901 A * | 5/1996 | Peppiette et al. ...... 257/547 |
| 2008/0124889 A1 * | 5/2008 | Roggenbauer et al. ... 257/547 |

FOREIGN PATENT DOCUMENTS

| DE | 42 09 523 C1 | 3/1993 |
| DE | 199 30 583 A1 | 1/2001 |
| DE | 199 53 333 A1 | 5/2001 |

\* cited by examiner

*Primary Examiner*—Thanh V Pham
*Assistant Examiner*—Errol Fernandes
(74) *Attorney, Agent, or Firm*—Slater & Matsil, L.L.P.

(57) ABSTRACT

A description is given of a concept for reducing shunt currents in a semiconductor body.

23 Claims, 5 Drawing Sheets

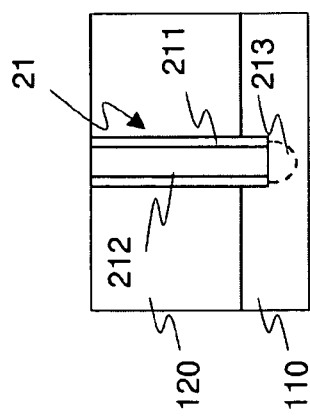
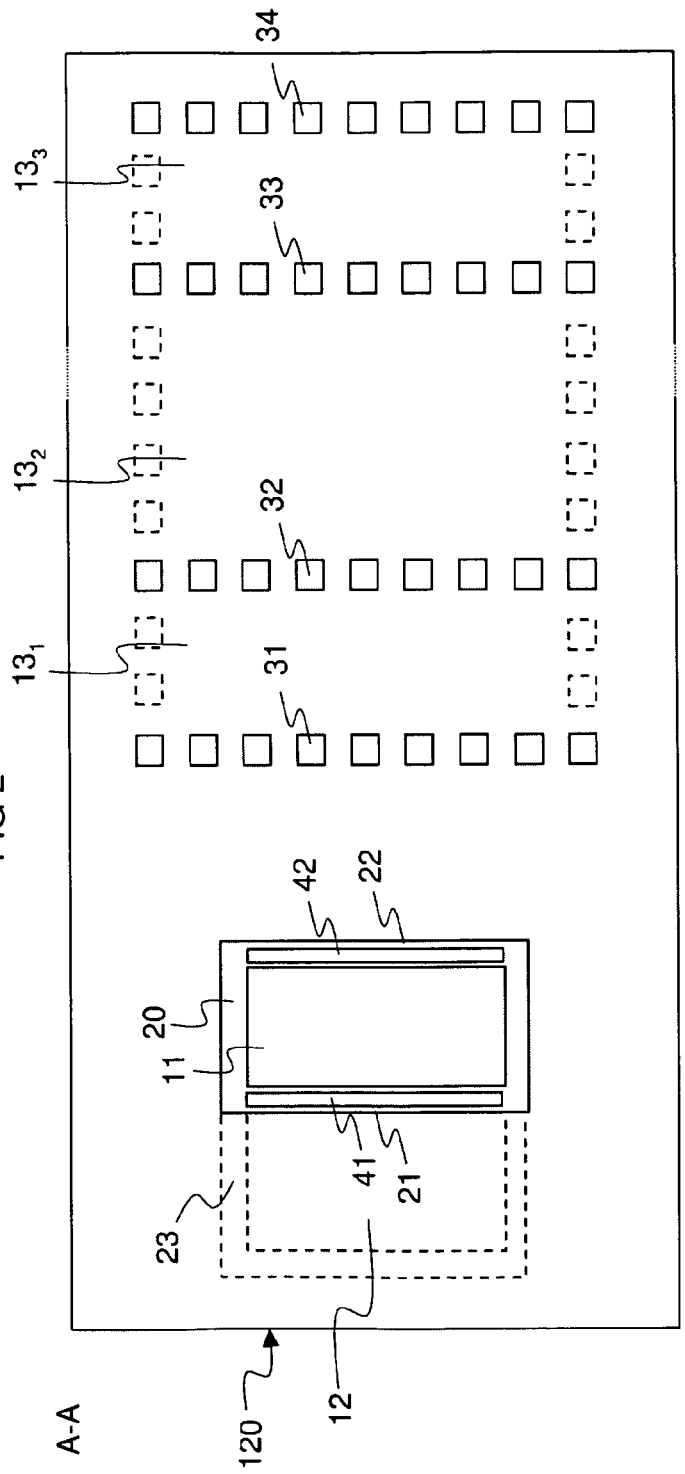

US 7,763,955 B2

REDUCING SHUNT CURRENTS IN A SEMICONDUCTOR BODY

BACKGROUND

If a plurality of semiconductor components are integrated in a semiconductor body, then it should be ensured that these components are sufficiently insulated from one another such that no mutual disturbances occur. One possibility for insulating the components from one another consists in providing, within the semiconductor body, pn junctions between those semiconductor regions in which the individual components are integrated, which are reverse-biased during normal operation of the individual components.

The semiconductor body comprises for example, a semiconductor layer, for example, a semiconductor substrate, of a first conduction type and a second semiconductor layer arranged on said semiconductor layer and having component zones of a second conduction type. In this case, pn junctions are formed between said component zones of the second conduction type and the first semiconductor layer and are biased during normal operation in such a way that no charge carriers are injected into the first semiconductor layer which might propagate there and disturb the function of other components. For the case where such charge carriers are, nevertheless, injected into the first semiconductor layer, there is a need for suitable measures which prevent adverse effects of said charge carriers.

SUMMARY

The present description relates to a semiconductor component arrangement comprising: a semiconductor body having a first semiconductor layer of a first conduction type and having a second semiconductor layer arranged on the first semiconductor layer, said second semiconductor layer defining a first side of the semiconductor body; a first component zone, a second component zone and a collective zone of a second conduction type, which is complementary to the first conduction type, in the second semiconductor layer; a first contact zone of the first conduction type, which is arranged in a lateral direction of the semiconductor body between the first component zone and the collective zone, which is connected to a connection for a defined bias voltage potential and which extends right into the first semiconductor layer proceeding from the first side through the second semiconductor layer; a second contact zone of the first conduction type, which is arranged in the lateral direction of the semiconductor body between the first component zone and the second component zone which is electrically conductively connected to the collective zone and which extends right into the first semiconductor layer proceeding from the first side through the second semiconductor layer; at least one third contact zone, which is electrically conductively connected to the collective zone, which is spaced apart further from the first component zone than the second contact zone and which, in the second component zone, extends right into the first semiconductor layer proceeding from the first side through the second semiconductor layer.

BRIEF DESCRIPTION OF THE FIGURES

Various examples are explained below with reference to the figures. In this case, the figures are not necessarily true to scale; rather, the main emphasis is on elucidating the basic principle. In this case, only the parts or component zones necessary for understanding said basic principle are illustrated in the figures. In the figures, unless indicated otherwise, identical reference symbols designate identical parts with the same meaning.

FIG. 2 illustrates an exemplary realization of a contact zone.

FIG. 4 illustrates an example of a semiconductor component arrangement comprising a plurality of pillar-type third contact zones, on the basis of an illustration of a lateral cross section through the semiconductor body.

DETAILED DESCRIPTION OF THE FIGURES

Figure 1:
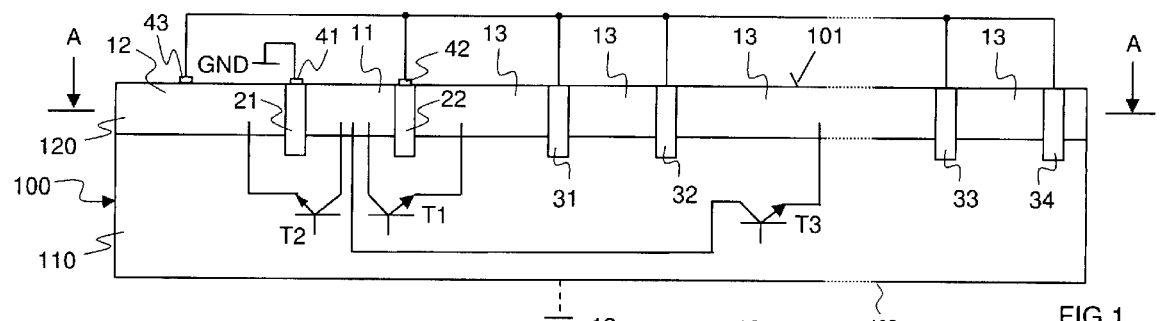
FIG. 1 illustrates an example of a semiconductor component arrangement comprising a first and a second component zone and first, second and third contact zones, on the basis of a cross-sectional illustration of a semiconductor body.

FIG. 1 illustrates a first example of a semiconductor component arrangement on the basis of a cross section through a semiconductor body 100. This semiconductor body 100 has a first side 101, which is also referred to hereinafter as front side, and a second side 102, remote from the first side 101, said second side also being referred to hereinafter as rear side. FIG. 1 shows a cross section through this semiconductor body 100 in a vertical sectional plane, that is to say a sectional plane running perpendicular to the front and rear sides 101, 102.

The semiconductor body 100 has a first semiconductor layer 110 of a first conduction type and a second semiconductor layer 120 arranged on the first semiconductor layer 110. The first semiconductor layer 110 is for example a semiconductor substrate, and the second semiconductor layer 120 is, for example, an epitaxial layer applied to said semiconductor substrate. A doping concentration of the first semiconductor layer 110 lies, for example, in the range of $10^{15}$ cm$^{-3}$. A doping concentration of the second semiconductor layer 120 can lie in the same range, but can also be higher and lie in the range of $10^{17}$ cm$^{-3}$, for example.

Arranged in the second semiconductor layer 120 are a collective zone 12 of a second conduction type, which is complementary to the first conduction type, and at least two component zones of the second conduction type: a first component zone 11 and a second component zone 13. These first and second component zones can be semiconductor zones produced by implantation or diffusion of dopant atoms into the second semiconductor layer 120. Furthermore, the second semiconductor layer 120 can be a semiconductor layer of the second conduction type. In this case, the first and second component zones 11, 13 and the collective zone 12 are semiconductor zones formed directly by the second semiconductor layer 120. The first and second component zones 11, 13 can contain, in a manner not illustrated in more specific detail, further doped semiconductor zones of the first and/or second conduction type, which are in each case part of semiconductor components which are integrated in the individual component zones and with which contact can be made via the front side 101 in a manner not illustrated in more specific detail.

Arranged between the first component zone 11 and the collective zone 12 is a first contact zone 21 of the first conduction type, which extends right into the first semiconductor layer 110 proceeding from the front side 101 through the second semiconductor layer 120. Said first contact zone 21 is connected to a connection for a defined bias voltage potential via a connection contact 41. The function and the choice of said bias voltage potential will be explained further below.

The first contact zone 21 and also the contact zones additionally explained below can be doped semiconductor zones which are doped complementarily with respect to the second semiconductor layer 120. A further example of a realization of the first contact zone is illustrated in FIG. 2. It should be pointed out in this connection that the explanations given for the first contact zone in connection with FIG. 2 are correspondingly also applicable to the other contact zones additionally explained. The contact zone 21 illustrated in FIG. 2 comprises an electrically conductive material 211, such as e.g. a highly doped polycrystalline semiconductor material, e.g. polysilicon when silicon is used for the semiconductor body, or a metal, which is insulated from the second semiconductor layer 120 by an insulation layer 212. The insulation layer 212 and the electrically conductive material extend at least as far as the boundary between the first and the second semiconductor layer 110, 120 or extend—as illustrated—right into the second semiconductor layer 120. The insulation layer 212 is composed of an oxide, for example.

Such a contact zone 21 is produced, for example, by: etching a trench extending right into the first semiconductor layer proceeding from the first side 101; producing the insulation layer at sidewalls of the trench, for example by thermal oxidation; if appropriate removing the insulation layer from the bottom of the trench; and filling the trench with the electrically conductive material.

When a doped polycrystalline semiconductor material is used for the conductive material, a doping type of this material corresponds in particular to the doping type of the first semiconductor layer. A connection zone of the same conduction type as the first semiconductor layer 110 can be adjacent to this conductive material 211 in the first semiconductor layer 110. This connection zone 213 can be produced, for example, by indiffusion of dopant atoms from the conductive material into the first semiconductor layer.

A contact zone 21 such as is illustrated in FIG. 2 has two functions: firstly, it serves to electrically insulate from one another semiconductor regions of the second semiconductor layer 120 which are adjacent to the contact zone 21 toward both sides in a lateral direction; and, secondly, it serves to connect the first semiconductor layer locally to a predetermined electrical potential. Owing to the first-mentioned property, the contact zone is also referred to hereinafter as insulation and contact zone.

A second contact zone of the first conduction type is present between the first component zone 11 and the second component zone 13, said second contact zone extending right into the first semiconductor layer 110 proceeding from the front side 101 through the second semiconductor layer 120. Said second contact zone 22 is electrically conductively connected to the collective zone 12 via a connection contact 42, said collective zone likewise having a connection contact 43 for this purpose. Said connection contact 43 can be a connection contact having a small area relative to the area of the collective zone 12. However, the dimensions of said connection contact can also lie in the range of the dimensions of the collective zone 12. In order to achieve a low-impedance connection of the individual connection contacts 41, 42, 43 to the respective semiconductor zones, highly doped connection zones (not illustrated) can be provided in the region of the contacts.

As is illustrated in FIG. 1, the first and second contact zones 21, 22 are adjacent to the first component zone 11 at opposite sides of said first component zone 11. The collective zone 12 and the second component zone 13 are thus situated at opposite sides of the first component zone 11 in a lateral direction of the semiconductor body 100. In this case, the second component zone 13 can be directly adjacent to the second connection zone 22, as illustrated in FIG. 1. However, the second component zone 13 can also be arranged in a manner spaced apart from the second contact zone 22 in a lateral direction of the semiconductor body 100.

During the operation of the semiconductor component arrangement, the first semiconductor layer 110 is at an electrical potential which is chosen taking account of the electrical potentials of the first and second component zones 11, 13 that occur during operation of the semiconductor component arrangement such that the pn junctions formed between the first and second component zones 11, 13 on the one hand, and the first semiconductor layer 110, on the other hand, are reverse-biased during "normal operation" of the semiconductor component arrangement. This bias voltage potential can be applied to the first semiconductor layer 110, for example, via a connection contact in the region of the rear side 102. However, the connecting of the first semiconductor layer 110 to said bias voltage potential, can also be effected via the first side 101 using contact zones, such as the first contact zone 21, for example. If the first semiconductor layer 110 is a p-doped semiconductor layer, then the bias voltage potential is chosen such that it is the lowest electrical potential which occurs in the semiconductor component arrangement during operation of the semiconductor component arrangement such as, e.g. ground. It is assumed for the explanation hereinafter that the first semiconductor layer 110 is such a p-doped semiconductor layer. However, the explanations below are correspondingly also applicable to an n-doped semiconductor layer. In this case, the bias voltage potential is the highest electrical potential which occurs in the semiconductor component arrangement during operation of the semiconductor component arrangement.

For reasons of a simplified illustration, further component structures and an interconnection of the semiconductor component integrated in the first component zone 11 are not illustrated in greater detail in FIG. 1. It shall now be assumed for the further explanation that owing to such an external interconnection—not illustrated in greater detail—of the component integrated in the first component zone, the first component zone 11 is pulled to an electrical potential at which the pn junction formed between the first component zone 11 and between the second semiconductor layer 120 is forward-biased. In the case of a p-doped second semiconductor layer 120 and an n-doped first component zone 11 this is an electrical potential which is negative with respect to the bias voltage potential, e.g. ground in the case of a p-doped second semiconductor layer 120. In this case, minority charge carriers, that is to say electrons in the case of a p-doped second semiconductor layer 120 or holes in the case of an n-doped second semiconductor layer 120, are injected into said second semiconductor layer 120. Said minority charge carriers can lead to malfunctions of the semiconductor components which are integrated in the second component zone 13 and which are not illustrated in more specific detail, such that a propagation of said minority charge carriers in the first semiconductor zone 11 in a direction of said second component zone 13 is undesirable.

The first and second contact zones 21, 22 form a first protective device that prevents the minority charge carriers from propagating in the direction of a second component zone 13. The function of said first and second contact zones 21, 22 is explained briefly below: the first component zone 11, the first semiconductor layer 110 and the second component zone 13 form a first bipolar transistor T1, the electrical circuit symbol of which is illustrated in FIG. 1. A second bipolar transistor T2, the electric circuit symbol of which is likewise illustrated in FIG. 1, is formed by the first component zone 11, the first semiconductor layer 110 and the collective zone 12. In the case of a p-doped first semiconductor layer 110 and n-doped first and second component zones 11, 13 and respectively an n-doped collective zone 12, said bipolar transistors are npn bipolar transistors as illustrated, otherwise said bipolar transistors are pnp bipolar transistors. The explanation below relates to npn bipolar transistors, but this explanation is correspondingly also applicable to pnp bipolar transistors.

The collector of the bipolar transistors is formed in each case by the first component zone 11 and their base is formed by the first semiconductor layer 110. The two bipolar transistors T1, T2 each have a current gain $\alpha_{npn}$ that is crucially determined by the electrical potential of the first semiconductor layer 110 in the region in which the two bipolar transistors are formed and in which the first semiconductor layer forms the base of the bipolar transistors T1, T2. In the case of the first bipolar transistor T1, this is the electrical potential of the collective zone 12, which the first semiconductor layer 110 is at in the region in which the first transistor T1 is formed. In the case of the second bipolar transistor T2, this is the bias voltage potential GND which the first semiconductor layer 110 is at in the region in which the second bipolar transistor T2 is formed. If minority charge carriers from the first component zone 11 are then injected into the first semiconductor layer 110 and if these charge carriers pass from there into the collective zone 12, then the electrical potential of the collective zone 12 changes. If the first semiconductor zone 110 is a p-doped semiconductor zone, then said minority charge carriers are electrons that bring about a decrease in the electrical potential of the collective zone 12 with respect to the bias voltage potential GND. This potential which is negative with respect to the bias voltage potential GND brings about via the second contact zone 22, a negative potential of the base of the first bipolar transistor T1. This negative potential brings about a reduction of the base-emitter voltage of said bipolar transistor T1 and thus a reduction of the current gain factor $\alpha_{npn}$ of said bipolar transistor T1. The second bipolar transistor T2 has a higher current gain factor $\alpha_{npn}$ in comparison therewith since the base of said bipolar transistor T2 is at the bias voltage potential GND. In this case, the difference in the current gain factors of the two bipolar transistors T1, T2 is all the more pronounced, the further the electrical potential of the collective zone 12 decreases with respect to the bias voltage potential GND. In this case, a positive feedback effect occurs insofar as the electrical potential of the collective zone 12 decreases further as electrons are increasingly transported into the collective zone 12, whereby the current gain factor of the first bipolar transistor T1 is decreased further and the electrons injected into the first semiconductor layer 110 are transported into the collective zone 12 to an even greater extent. In this way, the charge carriers injected into the first semiconductor layer 110 are conducted into the collective zone 12, and thus away from the second component zone 13 lying opposite the collective zone 12 with respect to the first component zone 11.

If only the first and second contact zones 21, 22 are present, there is the risk of minority charge carriers penetrating below the first component zone 11 in a vertical direction deeply into the first semiconductor layer 110, also propagating in the "depth" in a direction of the second component zone 13 and, at a distance from the first component zone 11, being injected into the second component zone 13, where they can bring about a disturbance/malfunction of the semiconductor components integrated there. In order to prevent or at least largely reduce this effect, the semiconductor component arrangement illustrated in FIG. 1 is provided with at least one further contact zone, which is arranged in a manner spaced apart from the first component zone 11 in a lateral direction of the semiconductor body, which extends right into the first semiconductor layer 110 proceeding from the front side 101 and which, like the second contact zone 22, is electrically conductively connected to the collective zone 12. It should be noted in this connection that the electrically conductive connections between the collective zone 12, on the one hand, and the second contact zone 22, and at least one third contact zone 31, on the other hand, are only illustrated schematically in FIG. 1. These conductive connections can be realized in the same way as conductive connections between individual components in a wiring level above the semiconductor body 100.

A plurality of such third contact zones 31-34 are present in the example illustrated in FIG. 1, said third contact zones being arranged in each case in a manner spaced apart from one another and spaced apart from the first component zone 11. These contact zones 31-34 ensure that the first semiconductor layer 110, including those regions which are arranged in a manner spaced apart from the first component zone 11, are at the electrical potential of the collective zone 12 and which thus reduce the current gain factor of a bipolar transistor formed by the first component zone 11, the first semiconductor layer 110 and a region of the second component zone 13 that is spaced apart from the first component zone 11. The circuit symbol of such a bipolar transistor is likewise illustrated in FIG. 1 and designated by T3.

Figure 3:
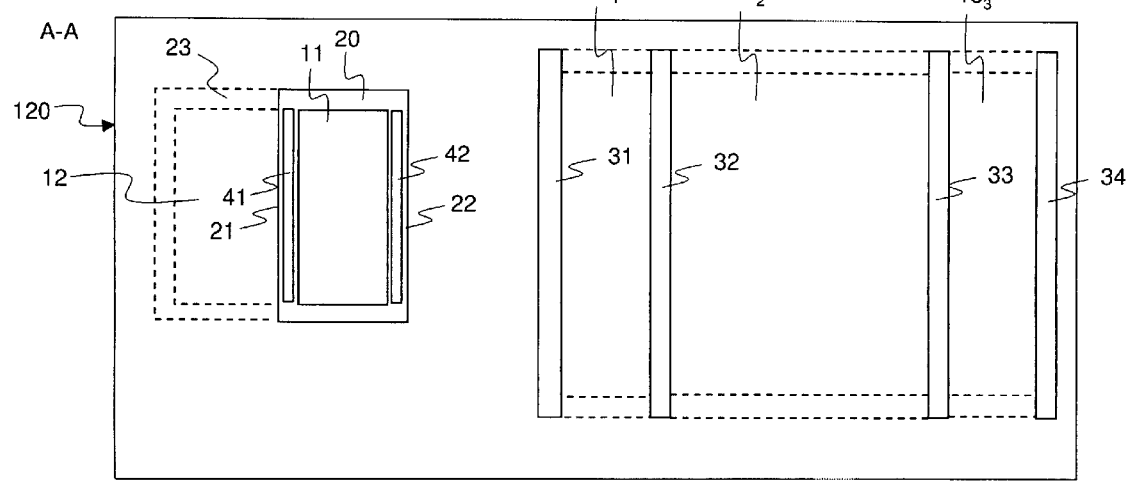
FIG. 3 illustrates an example of a semiconductor component arrangement comprising a plurality of wall-type third contact zones, on the basis of an illustration of a lateral cross section through the semiconductor body.

FIG. 3 shows a cross section in a lateral sectional plane A-A through a semiconductor body 100 of an example of a semiconductor component arrangement wherein the third contact zones 31-34 are realized as strip-type or wall-like zones. As illustrated by dashed lines in FIG. 3, said contact zones 31, 32, 33, 34 can be part of a—in plan view—grid-like structure of the first conduction type that defines various sections of a second component zone 13, which are designated by 13$_1$, 13$_2$, 13$_3$ in FIG. 3. Different semiconductor components that are independent of one another, can be integrated in these individual insular sections of the first conduction type which are in each case surrounded by semiconductor zones of the second conduction type.

Referring to FIG. 3 the first component zone 11 can be surrounded by an insulation and contact zone 20 in ring-shaped fashion in a lateral direction of the semiconductor body. In the example illustrated in FIG. 3, said insulation and contact zone 20 has, in plan view, a geometry of a rectangular ring, but can also have any other ring-shaped geometry. In this example, the first and second contact zones 21, 22 are part of the insulation and contact zone 20 wherein said ring-shaped zone 20 has for example a continuous electrically conductive material that is insulated from the second semiconductor layer 120 by an insulation layer.

A subdivision of the semiconductor zone 20 into the first and second contact zones 21, 22 is achieved in this case by the connection electrodes 41, 42 being arranged in a manner spaced apart from one another. In the example illustrated, said connection electrodes 41, 42 are realized as elongated electrodes. In this case, the first contact zone 21 is essentially formed by that region of the semiconductor zone 20 which is situated below said first connection electrode 41, and the second contact zone 22 is essentially formed by that region of the semiconductor zone 20 situated below the second connection electrode 42. On account of an unavoidably present ohmic resistance of the electrically conductive material of the insulation and contact zone 20, the mutual distance between the connection electrodes 41, 42 ensures that the first and second contact zones 21, 22 can be at different electrical potentials.

In the case of the rectangular semiconductor zone 20 illustrated in FIG. 3, the connection electrodes 41, 42 are arranged at opposite sides of the rectangular ring structure. Furthermore, in the example illustrated, the collective zone 12, the first component zone 11 and the second component zone 13 are part of a semiconductor layer 120 of the second conduction type, wherein further component zones required for realizing semiconductor components in the first and second component zones 11, 13 are not illustrated in FIG. 3 for reasons of clarity. In the example illustrated, the collective zone 12 is formed essentially by that region of the semiconductor layer 120 which is adjacent to the first contact zone 21 in a lateral direction. Optionally, the collective zone 12 can be surrounded by a further insulation and contact zone 23, which encloses the collective zone 12 jointly with the first contact zone 21 in ring-shaped fashion. Said further insulation and contact zone 23 can be at a predetermined electrical potential, such as e.g. the potential of the first semiconductor layer 110.

The second component zone 13 is formed by that region of the second semiconductor layer 120 which is surrounded by the ring-shaped structure 20 and the second component zone 13 is essentially formed by that region of the semiconductor layer 120 which is adjacent to the second contact zone 22 in a lateral direction.

Referring to FIG. 4, which shows a lateral cross section through the semiconductor body 100 of a semiconductor component arrangement in accordance with a further example, the third contact zones 31-34 can also be realized as pillar-type zones. In this case, a plurality of such pillar-type contact zones that are arranged in each case in a manner spaced apart from one another can form a grid-type structure which surrounds individual semiconductor regions $13_1$, $13_2$ and $13_3$ of the first conduction type like a "fence".

Figure 6:
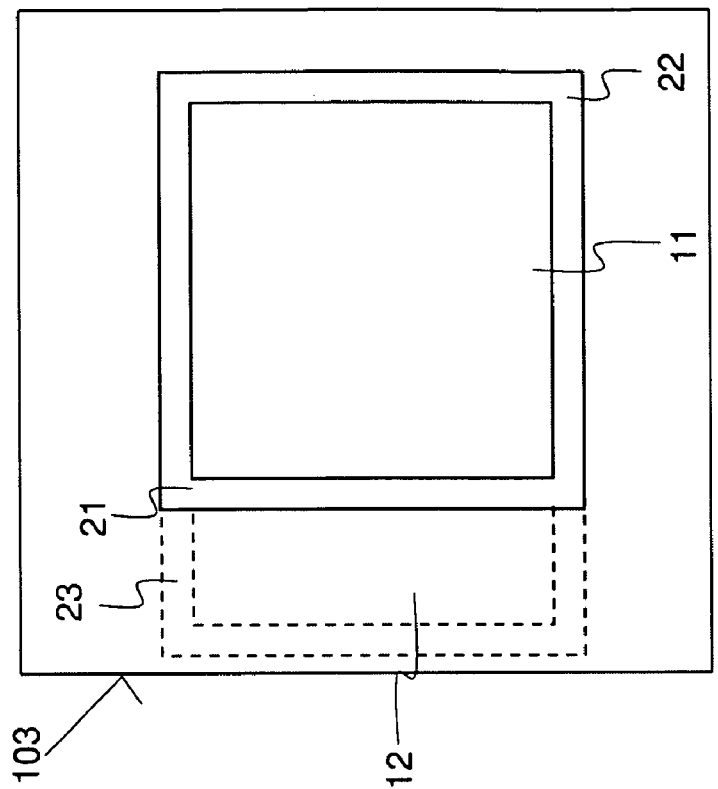
FIG. 6 illustrates an example of a semiconductor component arrangement wherein the first component zone is arranged in the region of an edge of the semiconductor body, on the basis of an illustration of a lateral cross section through the semiconductor body.
Figure 5:
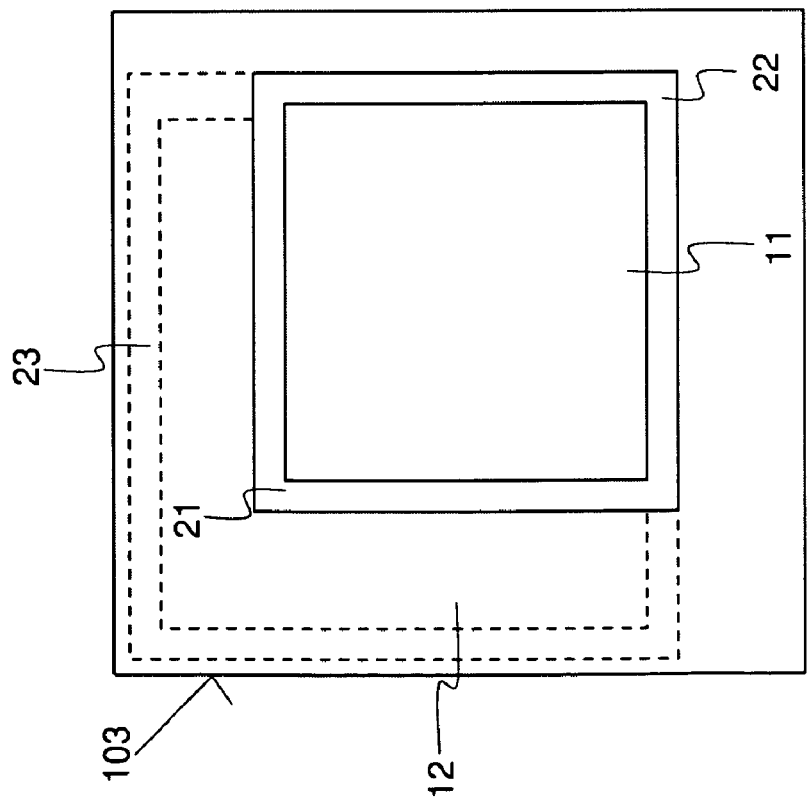
FIG. 5 illustrates an example of a semiconductor component arrangement wherein the first component zone is arranged in the region of a corner of the semiconductor body, on the basis of an illustration of a lateral cross section through the semiconductor body.

Referring to FIGS. 5 and 6, which in each case show a lateral cross section through the semiconductor body 100 of a semiconductor component arrangement in accordance with a further example, the first component zone 11 can be arranged in particular in the region of an edge 103 surrounding the semiconductor body 100 in a lateral direction. The at least one third contact zone is not explicitly illustrated in FIGS. 5 and 6. This contact zone can be realized in accordance with the previous explanations. In the example illustrated in FIG. 5, the first component zone 11 is arranged in the region of a corner of the semiconductor body 100, while in the example illustrated in FIG. 6, the first component zone 11 is arranged along the edge in a manner spaced apart from such a corner. In the examples illustrated in FIGS. 5 and 6, the first and second contact zones 21, 22 surround the first component zone 11 in ring-shaped fashion. In the example in accordance with FIG. 4, the first and second contact zones 21, 22 are embodied in each case in L-shaped fashion in plan view wherein the first contact zone 21 extends along the edge 103 of the semiconductor body 100. The second contact zone 22 "shields" the first component zone 11 from the other regions of the semiconductor body, in particular the second component zone 13. In both examples, the collective zone is arranged between the first contact zone 21 and the edge 103 and can be optionally delimited by the further contact zone 23.

In the example in accordance with FIG. 5, the second contact zone 22 has a U-shaped geometry in plan view, and the first contact zone 21 is embodied in plan view as an elongated semiconductor zone extending along the edge 103. In both cases, the first and second contact zones 21, 22 are arranged in a manner somewhat spaced apart from the edge 103 of the semiconductor body 100. In a manner not illustrated in more specific detail, a suitable edge termination, such as e.g. field rings or field plates, can be arranged in the intermediate region between the first and second contact zones 21, 22 and the edge 103.

Figure 7:
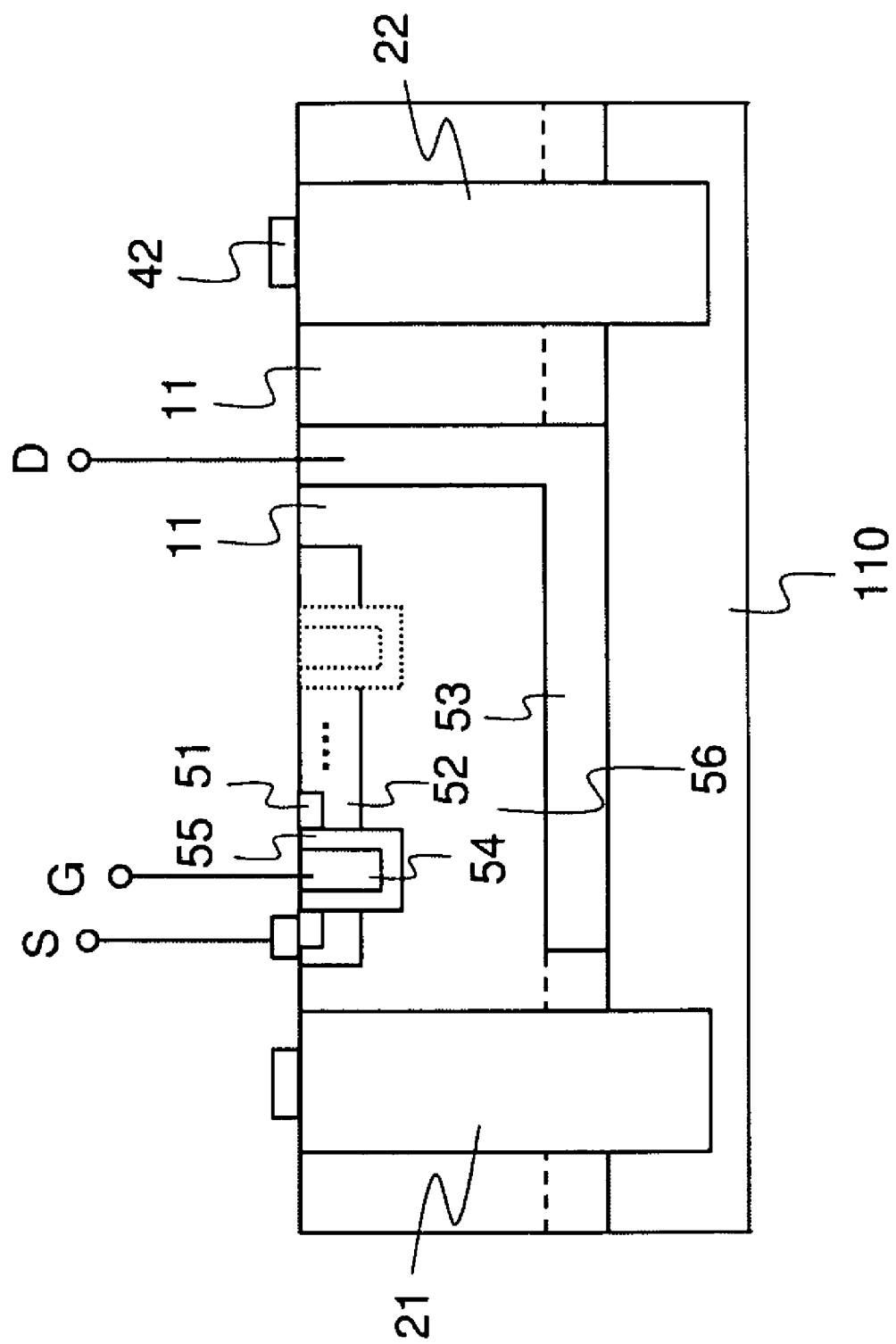
FIG. 7 illustrates a MOS transistor component integrated in the first component zone.

FIG. 7 illustrates an example of a semiconductor component integrated in the first component zone 11, on the basis of an illustration of a vertical cross section through said first component zone 11. The semiconductor component in accordance with this example is realized as a MOS transistor having a source zone 51, a body zone 52, a drain zone 53 and a drift zone 56. In this case, the body zone 52 is arranged between the source zone 51 and the drift zone 56, and the drain zone 53 is adjacent to the drift zone 56 at an opposite side to the body zone 52. The body zone 52 is additionally doped complementarily with respect to the source zone 51, the drift zone 56 and the drain zone 53. In the example illustrated, the last-mentioned component zones are component zones of the second conduction type, wherein the drift zone 56 is realized by those sections of the first component zone 11 which have a basic doping of said component zone 11. In the case of a component in which the first component zone 11 is part of a continuous semiconductor layer of the second conduction type, the drift zone 56 is a semiconductor zone whose doping corresponds to a basic doping of said second semiconductor layer.

A gate electrode 54 is present for controlling a conducting channel in the body zone 52 between the source zone 51 and the drift zone 56, said gate electrode being arranged adjacent to the body zone 52 and being dielectrically insulated from the body zone 52 by a gate dielectric 55. Said gate electrode can be arranged in a trench that extends right into the drift zone 56 proceeding from the front side 101 through the source zone 51 and the body zone 52. As illustrated by broken lines in FIG. 7, a plurality of source zones 51 and accordingly a plurality of gate electrodes can be present within the body zone 52. In the example illustrated, the drain zone 53 is arranged in a manner spaced apart from the body zone 52 in a vertical direction and can be adjacent to the first semiconductor layer 110. However, the drain zone 53 can also be arranged in a manner spaced apart from the first semiconductor layer 110 in a vertical direction. In this case, a section having the basic doping of the first component zone 11 is situated between the drain zone 53 and the first semiconductor layer 110. The drain zone—as illustrated by dashed lines—can be part of a continuous buried semiconductor layer (buried layer) arranged between the first and the second semiconductor layer 110, 120. The contact zones 21, 22 extend right into the first semiconductor layer through said buried layer.

The source zone 51 is connected to a source electrode, which is only illustrated schematically in FIG. 6, and which short-circuits the source zone 51 and the body zone 52. The drain zone 53 is correspondingly connected to a drain electrode D. For this purpose, the drain zone 53 has a section which extends as far as the front side 101 and which is arranged in a manner spaced apart from the body zone 52 in a lateral direction. Contact can be made with the gate electrode 54 via a gate electrode G.

It should be pointed out that the MOS transistor explained with reference to FIG. 6 should be regarded merely as a possible example of a semiconductor component which can be integrated in the first component zone 11. It goes without saying that any further semiconductor components can be realized in said component zone 11.

Figure 8:
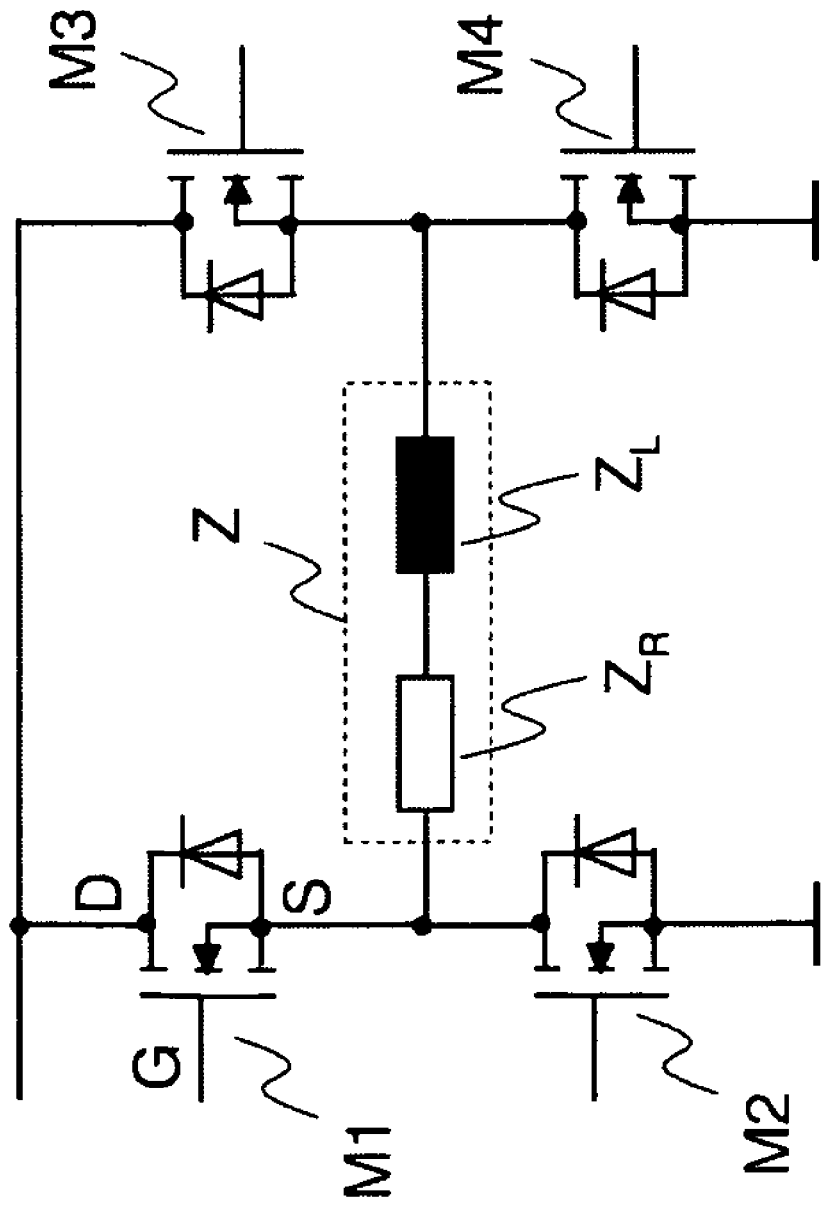
FIG. 8 shows an electrical circuit diagram of a bridge circuit comprising four transistors.

The MOS transistor explained with reference to FIG. 7 can be part of an electronic circuit. FIG. 8 shows the electrical equivalent circuit diagram of a bridge circuit comprising four such MOS transistors M1, M2, M3, M4 which serve for driving a load Z. In the example illustrated, said MOS transistors are realized as n-channel MOSFETS, of which in each case two M1, M2 and respectively M3, M4 are connected in series between terminals for supply potential V, GND. The two MOS transistors connected in series with one another in each case form a half-bridge, each having an output connection. This output connection is the connection which is common to the load paths of the two MOS transistors. The load Z is connected between the output connections of the two half-bridges. The MOS transistors M1, M4 can be driven in the on state and in the off state via their gate connections G. A drive circuit, for example, is used for this purpose, said drive circuit not being illustrated in more specific detail in FIG. 8. The individual MOS transistors each have free-wheeling diodes which are connected in parallel with the load paths or drain-source paths D-S of the individual MOS transistors and the circuit symbols of which are explicitly illustrated in FIG. 8. Said freewheeling diodes are formed in a known manner by the source and body zones of the MOS transistor being short-circuited with one another.

For driving the load Z, in the case of the circuit arrangement illustrated in FIG. 8, in each case two of the MOS transistors which lie diagonally opposite one another in the half-bridge, that is to say either of the MOS transistors M1 and M4 or the MOS transistors M3 and M2, are driven in the on state at a point in time, while the other two MOS transistors are turned off. If the load Z as in the example illustrated, has an inductive load component $Z_L$ ($Z_R$ designates the resistive load component in FIG. 8) then after the two MOS transistors previously driven in the on state are turned off, a freewheeling current must flow which commutates the load Z. If the transistors M3, M4 for example, are driven firstly in the on state and then in the off state, then such a freewheeling current can flow via the freewheeling diodes of the MOS transistors M2, M3. Since the source connection S of the MOS transistor M2 is fixedly at reference potential GND, it can happen during the flowing of a freewheeling current that the drain connection D of said MOS transistor M2 is pulled to an electrical potential which lies below the reference potential GND by the value of the forward voltage of the freewheeling diode. Assuming said transistor M2 is a transistor of the kind explained with reference to FIG. 7, the pn junction with respect to the drain zone 53 or the first component zone 11 and the first semiconductor layer 110 will be forward-biased, which leads to the injection of charge carriers as explained above. If said transistor is part of a semiconductor circuit arrangement of the kind explained with reference to FIGS. 1 to 6, then a propagation of these charge carriers injected into the first semiconductor layer 110 is largely prevented.

The invention claimed is:

1. A semiconductor component arrangement comprising:
    a semiconductor body having a first semiconductor layer of a first conduction type and having a second semiconductor layer arranged on the first semiconductor layer, said second semiconductor layer defining a first side of the semiconductor body;
    in the second semiconductor layer: a first component zone, a second component zone and a collective zone of a second conduction type, which is complementary to the first conduction type;
    a first contact zone, which is arranged in a lateral direction of the semiconductor body between the first component zone and the collective zone, which is connected to a connection for a defined bias voltage potential and which extends right into the first semiconductor layer proceeding from the first side through the second semiconductor layer;
    a second contact zone, which is arranged in the lateral direction of the semiconductor body between the first component zone and the second component zone which is electrically conductively connected to the collective zone and which extends right into the first semiconductor layer proceeding from the first side through the second semiconductor layer;
    at least one third contact zone, which is electrically conductively connected to the collective zone, which is spaced apart further from the first component zone than the second contact zone and which, in the second component zone, extends right into the first semiconductor layer proceeding from the first side through the second semiconductor layer, wherein the first and second contact zones have an electrically conductive material, and an insulation layer that insulates the electrically conductive material from the second semiconductor layer.

2. The semiconductor component arrangement as claimed in claim 1,
    wherein the second semiconductor layer comprises a semiconductor layer of the second conduction type and
    wherein the first and second component zones and the collective zone are formed by sections of said second semiconductor layer.

3. The semiconductor component arrangement as claimed in claim 1,
    wherein the first and the second contact zones are arranged at opposite sides of the first component zone and
    wherein the second component zone is arranged at a side of the first component zone which is remote from the collective zone.

4. The semiconductor component arrangement as claimed in claim 1,
    wherein the first component zone is surrounded by a guard ring zone of the first conduction type in the second semiconductor layer, said guard ring zone extending right into the first semiconductor layer proceeding from the first side through the second semiconductor layer,
    wherein the first and the second contact zones are each formed from sections of said guard ring zone.

5. The semiconductor component arrangement as claimed in claim 4, wherein the first and the second contact zone are formed by those sections of the guard ring zone which lie opposite one another relative to the first component zone.

6. The semiconductor component arrangement as claimed in claim 1, wherein the at least one third contact zone is embodied in wall-type fashion.

7. The semiconductor component arrangement as claimed in claim 1, which comprises a plurality of wall-type third contact zones arranged in a manner spaced apart from one another.

8. The semiconductor component arrangement as claimed in claim 1, wherein the at least one third contact zone is embodied in ring-shaped fashion and surrounds a section of the second component zone in the second semiconductor layer in ring-shaped fashion.

9. The semiconductor component arrangement as claimed in claim 1, wherein the at least one third contact zone comprises a plurality of contacts arranged in ring-shaped fashion surrounding a portion of the second component zone.

10. The semiconductor component arrangement as claimed in claim 7, wherein at least two of the third contact zones embodied in ring-shaped fashion are adjacent to one another.

11. The semiconductor component arrangement as claimed in claim 1, wherein the at least one third contact zone is embodied in pillar-type fashion.

12. The semiconductor component arrangement as claimed in claim 1, which comprises a plurality of pillar-type third contact zones arranged in a manner spaced apart from one another.

13. The semiconductor component arrangement as claimed in claim 1,
wherein the semiconductor body has an edge, and
wherein the first component zone is arranged in the region of said edge and the collective zone is arranged between the edge and the first component zone.

14. The semiconductor component arrangement as claimed in claim 1, further comprising a transistor component in the first component zone.

15. The semiconductor component arrangement as claimed in claim 14, wherein the transistor component comprises a MOS transistor component of the second conduction type.

16. A semiconductor component arrangement comprising:
a first semiconductor layer of a first conduction type disposed on a substrate;
a second semiconductor layer disposed on the first semiconductor layer, said second semiconductor layer defining a top surface;
a first component zone, a second component zone and a collective zone disposed adjacently in the second semiconductor layer, the first component zone being disposed between the collective zone and the second component zone along a first direction, the first component zone and the collective zone having a second conduction type opposite the first conduction type;
a first contact disposed between the first component zone and the collective zone, and coupled to a voltage node;
a second contact disposed between the first component zone and the second component zone, and electrically coupled to the collective zone,
a third contact disposed within the second component zone, and electrically coupled to the collective zone and electrically isolated from the second component zone, wherein the first, the second, and the third contact extend from the top surface of the second semiconductor layer into the first semiconductor layer and comprise the first conduction type.

17. The semiconductor component arrangement as claimed in claim 16, wherein a width of the third contact is smaller than a width of the second component zone, wherein the widths are measured along a second direction perpendicular to the first direction.

18. The semiconductor component arrangement as claimed in claim 16, wherein a width of the second component zone is larger than a width of the first component zone, wherein the widths are measured along a second direction perpendicular to the first direction.

19. The semiconductor component arrangement as claimed in claim 16, wherein a width of the first component zone is about the same as a width of the first contact, wherein the widths are measured along a second direction perpendicular to the first direction.

20. The semiconductor component arrangement as claimed in claim 16, further comprising a plurality of contacts arranged in ring-shaped fashion surrounding a portion of the second component zone, the plurality of contacts being similar to and comprising the third contact.

21. The semiconductor component arrangement as claimed in claim 16, wherein the third contact is directly coupled to the collective zone.

22. A semiconductor component arrangement comprising:
a first semiconductor layer of a first conduction type disposed on a substrate;
a second semiconductor layer disposed on the first semiconductor layer, said second semiconductor layer defining a top surface;
a first component zone, a second component zone and a collective zone disposed adjacently in the second semiconductor layer, the first component zone being disposed between the collective zone and the second component zone along a first direction, the first component zone and the collective zone having a second conduction type opposite the first conduction type;
a first contact disposed between the first component zone and the collective zone, and coupled to a voltage node;
a second contact disposed along a second direction between the first component zone and the second component zone in the first direction, and electrically coupled to the collective zone,
a third contact electrically coupled to the collective zone, wherein the first, the second, and the third contact extend from the top surface of the second semiconductor layer into the first semiconductor layer and comprise the first conduction type, wherein a width of the third contact is smaller than a width of the second component zone, and wherein the widths are measured along the second direction perpendicular to the first direction.

23. The semiconductor component arrangement as claimed in claim 22, wherein a width of the first component zone is about the same as a width of the first contact along the second direction.

* * * * *